United States Patent

McIntyre

(10) Patent No.: US 9,391,652 B1
(45) Date of Patent: Jul. 12, 2016

(54) ELECTRONIC DEVICE WITH RF TRANSMISSION LINE STUB AND RF SHORTING SWITCH CONFIGURATION AND RELATED METHODS

(71) Applicant: Harris Corporation, Melbourne, FL (US)

(72) Inventor: John Robert McIntyre, Rochester, NY (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

(21) Appl. No.: 14/699,410

(22) Filed: Apr. 29, 2015

(51) Int. Cl.
*H01Q 11/12* (2006.01)
*H04B 1/04* (2006.01)

(52) U.S. Cl.
CPC ...... *H04B 1/0475* (2013.01); *H04B 2001/0408* (2013.01)

(58) Field of Classification Search
CPC ....... H03F 1/0222; H03F 1/0272; H03F 3/24; H03F 3/60; H03F 2200/15; H03F 2200/412; H03G 3/3042; H04B 1/4058
USPC .............................. 455/124, 125, 127.1, 127.4
See application file for complete search history.

(56) References Cited

U.S. PATENT DOCUMENTS

| 3,414,833 | A | 12/1968 | Tolliver | |
|---|---|---|---|---|
| 6,236,274 | B1 * | 5/2001 | Liu | H03F 3/217 330/302 |
| 7,340,228 | B2 * | 3/2008 | Monroe | H03F 1/0244 330/129 |
| 7,764,125 | B2 * | 7/2010 | Dawe | H03F 1/56 330/302 |
| 2004/0104785 | A1 | 6/2004 | Park et al. | |
| 2012/0176205 | A1 | 7/2012 | Furuta et al. | |
| 2014/0125135 | A1 * | 5/2014 | Walker | H03F 1/0222 307/77 |

FOREIGN PATENT DOCUMENTS

EP 1 914 886 4/2008
EP 2 278 705 8/2011

* cited by examiner

*Primary Examiner* — Simon Nguyen
(74) *Attorney, Agent, or Firm* — Allen, Dyer, Doppelt, Milbrath & Gilchrist, P.A.

(57) ABSTRACT

A communications device may include a power amplifier having an input and an output, and a direct current (DC) feed network. The DC feed network may include a radio frequency (RF) transmission line stub having a first end coupled to the output of the power amplifier and a second end coupled to a DC feed voltage, and at least one RF shorting switch coupled between a corresponding location along the RF transmission line stub and a voltage reference. The communications device may further include a controller configured to selectively operate the at least one RF shorting switch to set an operating frequency band of the power amplifier.

22 Claims, 8 Drawing Sheets

ELECTRONIC DEVICE WITH RF TRANSMISSION LINE STUB AND RF SHORTING SWITCH CONFIGURATION AND RELATED METHODS

FIELD OF THE INVENTION

The present invention relates to communications devices, and more particularly to power amplifier configurations for wireless communications devices and related methods.

BACKGROUND OF THE INVENTION

Power amplifiers for wireless (e.g., radio frequency or RF) communications devices may use transistors which require a DC power feed that isolates RF energy. While gallium nitride (GaN) technology has extended transistor power amplifier RF operating bandwidth capabilities, bias feed networks may provide an impediment to such capabilities in some applications.

More particularly, for low frequency and broad-band amplifiers, DC power feeds are typically injected with an inductor, or bias choke, which passes DC but blocks RF energy. Yet, as signal bandwidths are extended, the reactance (inductance) of the bias feed network may cause problems, including non-quasi stable distortion (memory-like) effects. This distortion may not be correctable with memory-less (LUT-based) pre-distortion linearization techniques, for example.

Historically, for high frequency and narrow band amplifiers, the DC power feed is achieved using a quarter-wave shorted line. This presents an "open" impedance to the PA at RF frequencies, and a low-inductance short at baseband frequencies.

Despite the existence of such configurations, further enhancements for power amplifier feed networks may be desired in certain applications.

SUMMARY OF THE INVENTION

A communications device may include a power amplifier having an input and an output, and a direct current (DC) feed network. The DC feed network may include a radio frequency (RF) transmission line stub having a first end coupled to the output of the power amplifier and a second end coupled to a DC feed voltage, and at least one RF shorting switch coupled between a corresponding location along the RF transmission line stub and a voltage reference. The communications device may further include a controller configured to selectively operate the at least one RF shorting switch to set an operating frequency band of the power amplifier.

More particularly, the at least one RF shorting switch may comprise a plurality of RF shorting switches coupled to spaced apart locations along the RF transmission line stub. By way of example, the at least one RF shorting switch may comprise at least one PiN diode.

The DC feed network may further include a capacitor in series with the at least one RF shorting switch. In addition, the DC feed network may also include an inductor, and the controller may selectively couple the inductor between the DC feed voltage and the first end of the RF transmission line stub to provide narrowband operation, and selectively couple the DC feed voltage to the first end of the RF transmission line stub to provide wideband operation. More particularly, the DC feed network may also include a baseband shorting capacitor coupled between the first end of the RF transmission line stub and the voltage reference.

By way of example, the power amplifier may comprise a field effect transistor (FET) having a gate as the input, a source coupled to the voltage reference, and a drain as the output. Furthermore, a gate feed network may be coupled to the gate of the FET. An input matching network may also be coupled to the gate of the FET, and an output matching network may be coupled to the drain of the FET.

A related method is for operating a power amplifier having an input and an output. The method may include selectively operating at least one RF shorting switch coupled between a corresponding location along a radio frequency (RF) transmission line stub and a voltage reference to set an operating frequency band of the power amplifier. The RF transmission line stub may have a first end coupled to the output of the power amplifier and a second end coupled to a DC feed voltage.

DETAILED DESCRIPTION OF THE EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
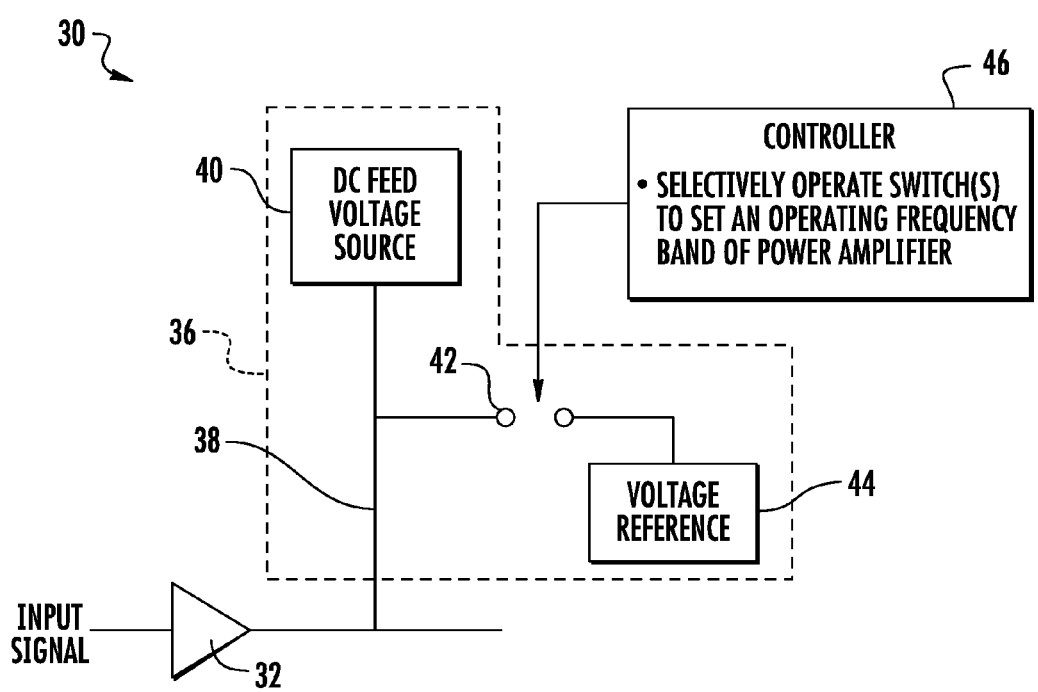
FIG. 1 is a schematic block diagram of a communications device including a power amplifier with a DC feed network providing selective frequency band switching as in the present invention.

Referring initially to FIG. 1, a communications device 30 is first described. The communications device 30 illustratively includes a power amplifier 32 having an input and an output, and a direct current (DC) feed network 36. The DC feed network illustratively includes a radio frequency (RF) transmission line stub 38 having a first end coupled to the output of the power amplifier 32, and a second end coupled to a DC feed voltage source 40, and one or more RF shorting switches 42 coupled between a corresponding location along the RF transmission line stub and a voltage reference 44 (e.g., ground). The communications device 30 further illustratively includes a controller 46 configured to selectively operate the RF shorting switch(es) to set an operating frequency band of the power amplifier 32, as will be described further below. The controller 46 may be implemented using hardware (e.g., microprocessor, etc.) and a corresponding non-transitory computer-readable medium having computer-executable instructions for performing the various operations described herein, for example, as will be appreciated by those skilled in the art.

Figure 2:
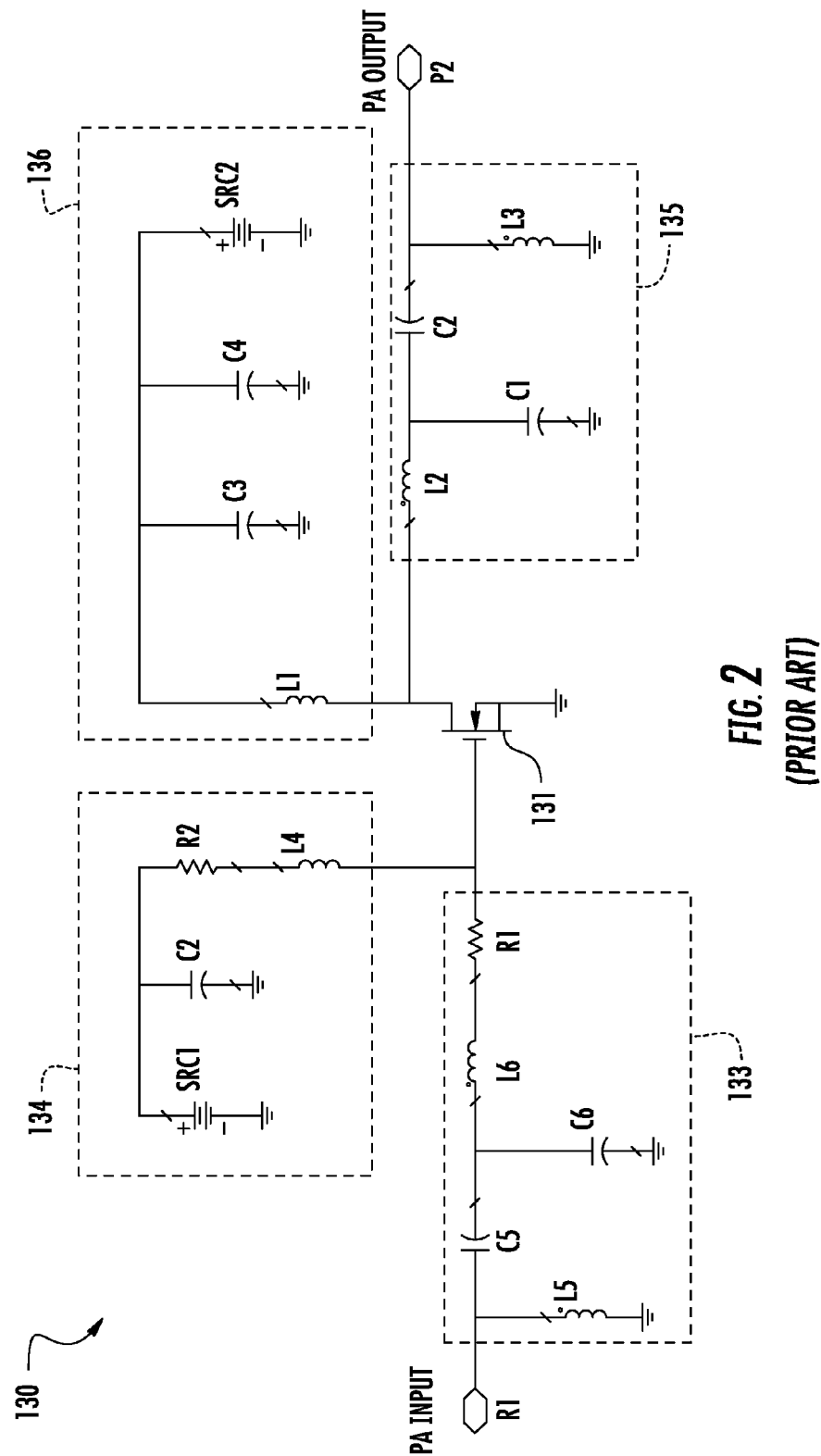
FIGS. 2 and 3 are schematic diagrams of prior art power amplifier configurations.

By way of background, a first prior art power amplifier feed/bias network configuration 130 is shown in FIG. 2. A MOSFET power amplifier 131 has a gate connected to a power amplifier (PA) input P1 via an input matching network 133. The input matching network illustratively includes a capacitor C5, inductor L6, and resistor R1 connected in series between the PA input P1 and the gate. Moreover, an inductor L5 is coupled between the PA input PA1 and ground, and a capacitor C6 has a first terminal coupled between the capacitor C5 and the inductor L6, and a second terminal connected to ground. Furthermore, a gate feed network 134 is also connected to the gate of the MOSFET 131. The gate feed network 134 illustratively includes a DC voltage source SRC1, and a resistor R2 and inductor L4 connected in series between the DC voltage source SRC1 and the gate. Moreover, a capacitor C7 has a first terminal connected between the DC voltage source SRC1 and the resistor R2, and a second terminal connected to ground.

Additionally, an output matching network 135 is connected between the drain of the MOSFET 131 and a PA output P2. The output matching network 135 illustratively includes an inductor L2 and a capacitor C2 connected in series between the drain and the PA output P2. A capacitor C1 has a first terminal connected between the inductor L2 and the capacitor C2, and a second terminal connected to ground. An inductor L3 has a first terminal connected between the capacitor C2 and the PA output P2, and a second terminal connected to ground.

The configuration 130 further illustratively includes a drain feed network coupled to the drain of the MOSFET 131. The drain feed network 136 illustratively includes a DC voltage source SRC2, and an inductor L1 coupled between the voltage source SRC2 and the drain of the MOSFET 131. Capacitors C3 and C4 have at respective first terminals coupled between the DC voltage source SRC2 and inductor L1, and they have second terminals coupled to ground. The capacitor C4 may be chosen to provide a short at baseband frequencies (e.g., ~10 uH), and the capacitor C3 may be chosen to provide a short at RF frequencies (e.g., ~100 pF). A value of the drain feed inductor L1 is generally chosen such that ZL is very small at 3× a maximum baseband frequency, and so that ZL is very large at the minimum RF operating frequency.

A potential problem with the configuration 130 is that as baseband frequencies get larger and larger, any useful inductance will be reactive at baseband frequencies and harmonics, causing voltage drops with envelope driven current peaks. Moreover, when implementing very wide RF band amplifiers which pass wide signal bandwidths, these constraints conflict. As such, while this configuration may work for multi-octave amplifiers, it may not be able to provide envelope tracking or very wideband signals.

Figure 3:
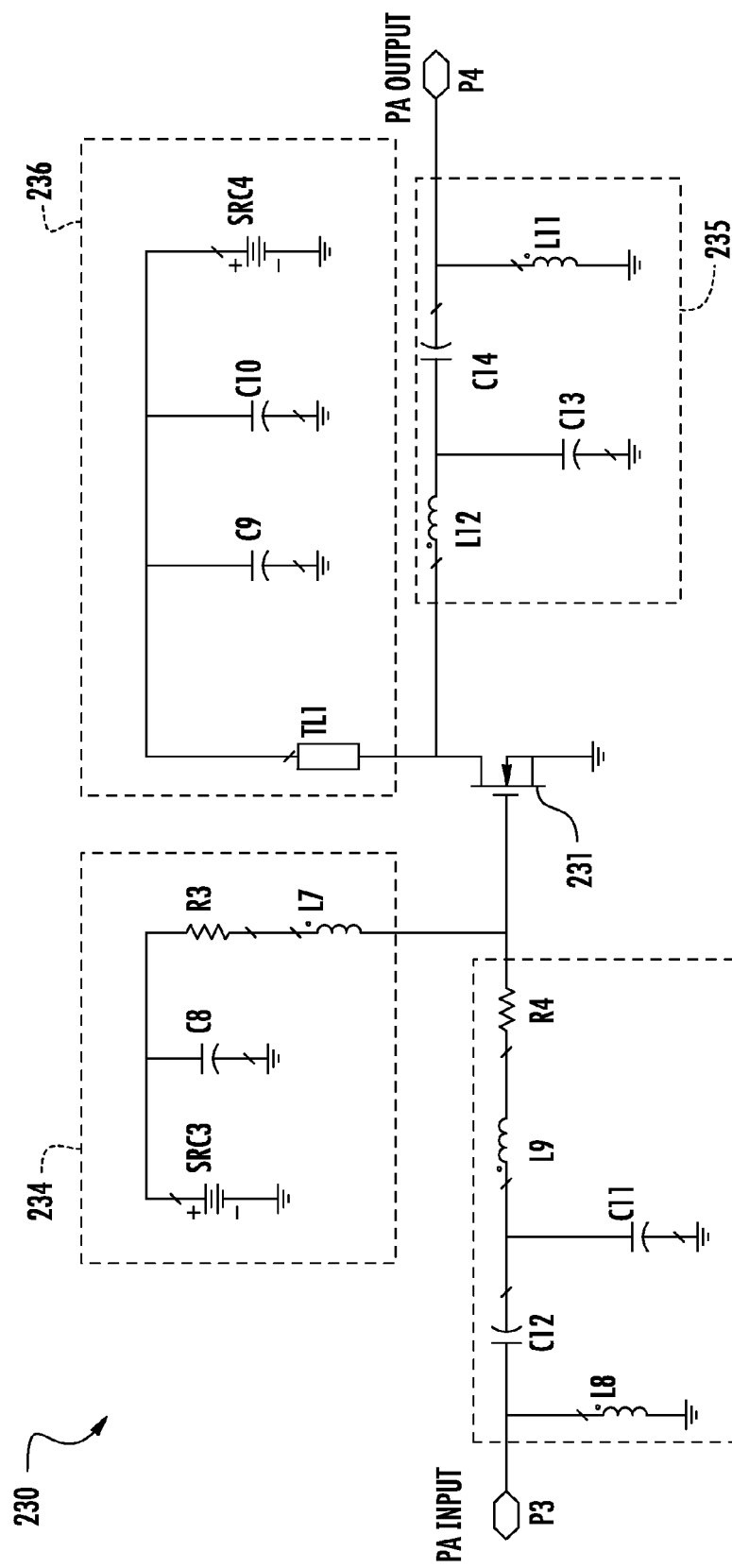

Another prior art configuration 230 is now described with reference to FIG. 3. A MOSFET power amplifier 231 has a gate connected to a power amplifier (PA) input P3 via an input matching network 233. The input matching network 233 illustratively includes a capacitor C12, inductor L9, and resistor R4 connected in series between the PA input P3 and the gate. Moreover, an inductor L8 is coupled between the PA input PA3 and ground, and a capacitor C11 has a first terminal coupled between the capacitor C12 and the inductor L9, and a second terminal connected to ground. Furthermore, a gate feed network 234 is also connected to the gate of the MOSFET 231. The gate feed network 234 illustratively includes a DC voltage source SRC3, and a resistor R3 and inductor L7 connected in series between the DC voltage source SRC3 and the gate. Moreover, a capacitor C8 has a first terminal connected between the DC voltage source SRC3 and the resistor R3, and a second terminal connected to ground.

Additionally, an output matching network 235 is connected between the drain of the MOSFET 231 and a PA output P4. The output matching network 235 illustratively includes an inductor L12 and a capacitor C14 connected in series between the drain and PA output P4. A capacitor C13 has a first terminal connected between the inductor L12 and the capacitor C14, and a second terminal connected to ground. An inductor L11 has a first terminal connected between the capacitor C14 and the PA output P4, and a second terminal connected to ground.

The configuration 230 further illustratively includes a drain feed network 236 coupled to the drain of the MOSFET 231. The drain feed network 236 illustratively includes a DC voltage source SRC4, and an inductor TL1 coupled between the voltage source SRC4 and the drain of the MOSFET 231. Capacitors C9 and C10 have respective first terminals coupled between the DC voltage source SRC4 and inductor TL1, and they have second terminals coupled to ground.

The drain feed network 236 provides a quarter wave shorted line configuration. Such a configuration results in relatively low inductance to baseband frequencies, yet it also blocks RF frequencies over approximately one octave centered at the frequency were electrical length is 90 degrees. This works for single-octave amplifiers for envelope tracking while allowing relatively wide signal bandwidths.

For newer PA efficiency enhancement techniques like envelope tracking, any reactance in the drain feed network significantly deteriorates performance. Historically, for high frequency and narrow band amplifiers, the DC power feed was achieved using quarter-wave shorted line approaches, such as the one described above with reference to FIG. 3. However, this presents an "open" impedance to the PA at RF frequencies, and a low-inductance short at baseband frequencies. As noted above, quarter-wave short feed networks are generally limited to a single octave of PA RF bandwidth. Thus, such configurations are unable to implement envelope tracking in multi-octave power amplifiers due to the associated drain-feed network issues.

Figure 4:
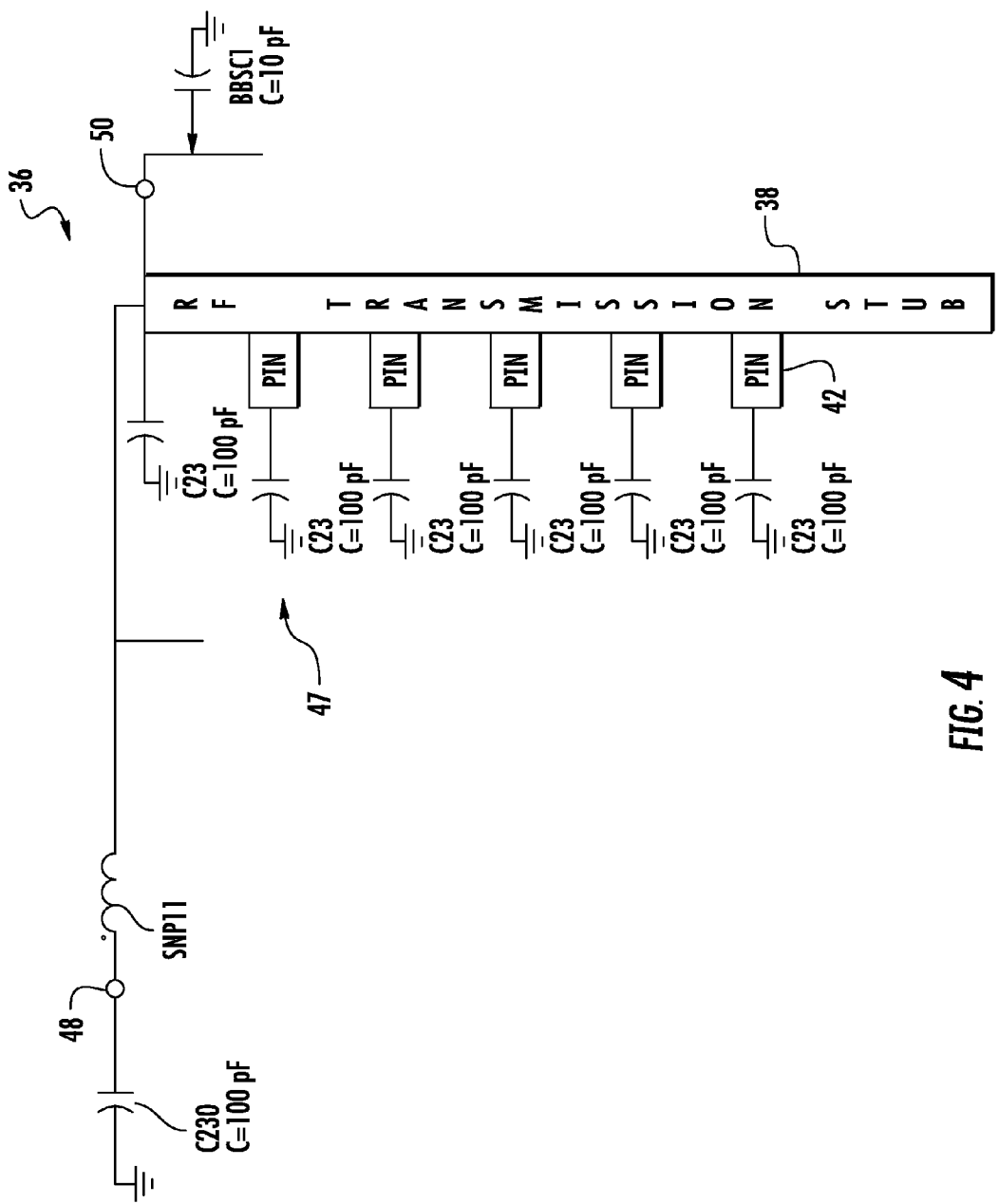
FIG. 4 is a schematic diagram of an example implementation of the DC feed network of FIG. 1.

In accordance with an example embodiment now described with reference to FIG. 4, an example implementation of the drain feed network 36 is provided. It should be noted that the drain feed network 36 may also be used in place of the drain feed networks 136 or 236 described above, as well as in other power amplifier configurations. In the illustrated configuration, there are a plurality of switching branches 47 each of which includes a respective shorting switch 42. Each shorting switch 42 is coupled to the RF transmission line stub 38 at respective spaced apart locations between the first and second ends thereof. More particularly, in the illustrated example the switches 42 are PiN diodes, and there are five branches 47 (although different numbers of branches may be used in different embodiments). Moreover, each branch 47 also illustratively includes a respective shorting capacitor C23 coupled between each switch 42 and the voltage reference (here ground).

The DC feed network 36 further illustratively includes an inductor SNP11 and a capacitor 0230 coupled between the second end of the RF transmission line stub 38 and ground. More particularly, the controller 46 may selectively couple the inductor SNP11 between the DC feed voltage and the second end of the RF transmission line stub 38 to provide narrowband operation, and selectively couple the DC feed voltage directly to the second end of the RF transmission line stub to provide wideband operation. That is, the DC feed voltage may be applied at a terminal 48 during a narrowband operating mode, and at a terminal 50 during a wideband operating mode. The DC feed network 36 may further include a baseband shorting capacitor BBSC1 coupled between the second end of the RF transmission line stub 38 and ground.

The DC feed network 36 accordingly provides a quarter wave shorted line configuration that also covers a lowest required RF frequency for which envelope tracking (ET) is to be implemented. In operation, the RF transmission line stub 38 is "shortened" by selectively turning on the PiN diodes 42, starting farthest away from the power amplifier 32 and sequentially moving closer (although a non-sequential switching order may be used in some embodiments). This essentially "moves" the short closer and closer to the power amplifier 32, and accordingly "shortens" the RF transmission line stub 38 length for higher frequency operation, as will be appreciated by those skilled in the art. Moreover, if narrowband operation is desired at relatively low frequencies, such as in the VHF/UHF bands, the inductor SNP11 may be added at the first end of the RF transmission line stub 38 as noted above. That is, the DC bias voltage may be fed through the inductor SNP11 in those instances when operation using such narrowband waveforms is desired.

Figure 5:
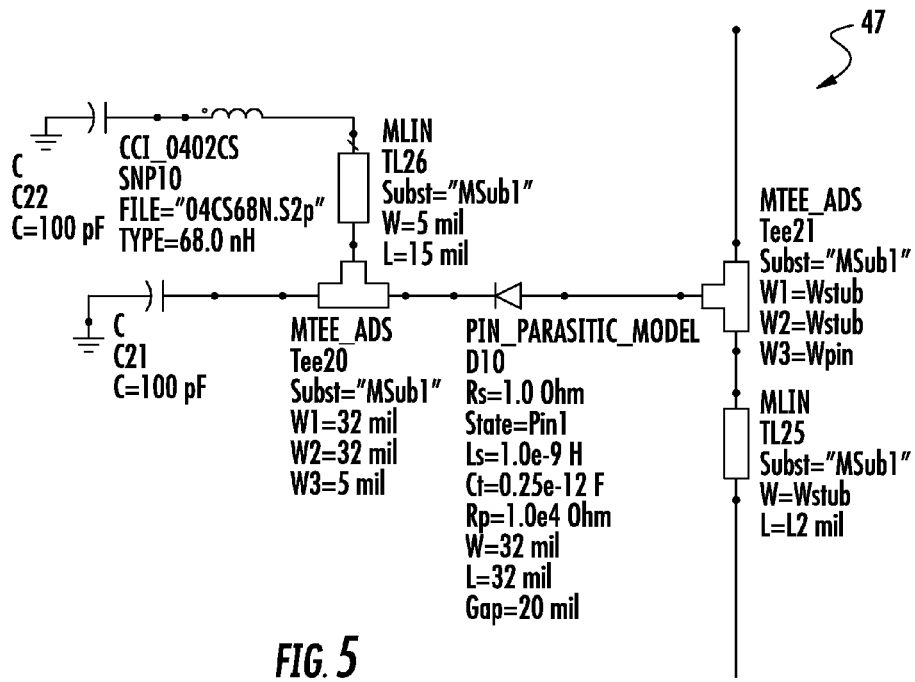
FIG. 5 is a schematic block diagram of a RF shorting switching branch which may be used with the DC feed network of FIG. 4.
Figure 6:
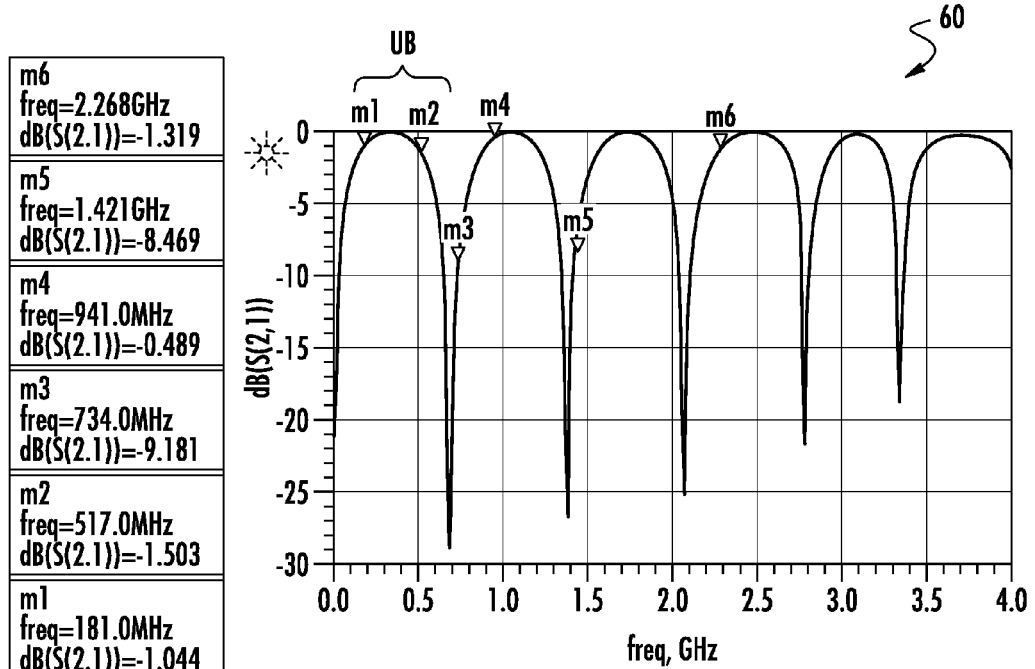
FIGS. 6-11 are a series of graphs of output power vs. frequency for the power amplifier of FIG. 4 for different RF shorting switching configurations.
Figure 7:
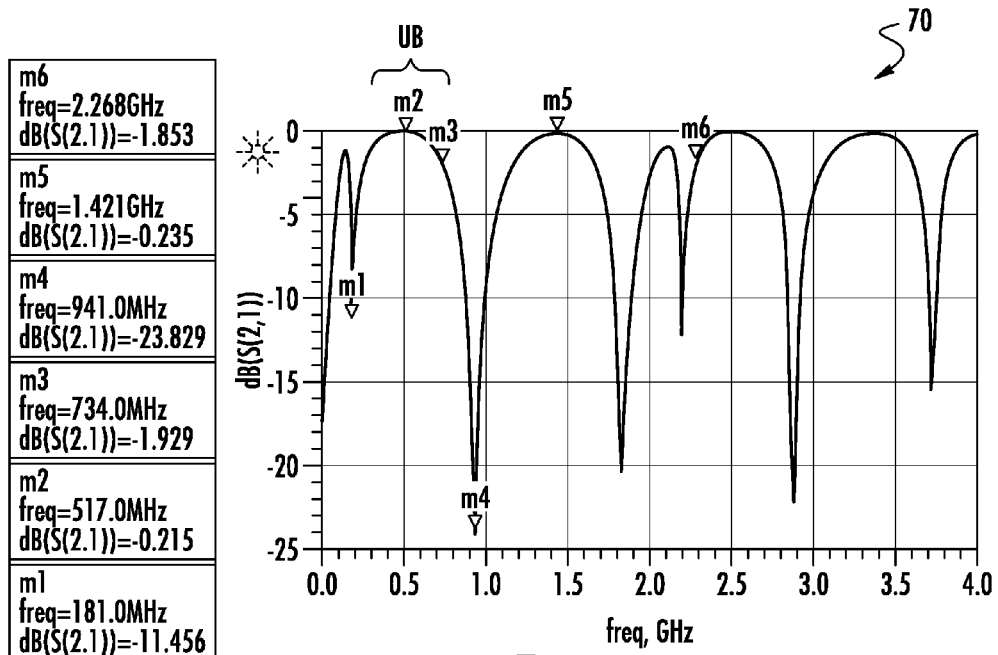
Figure 8:
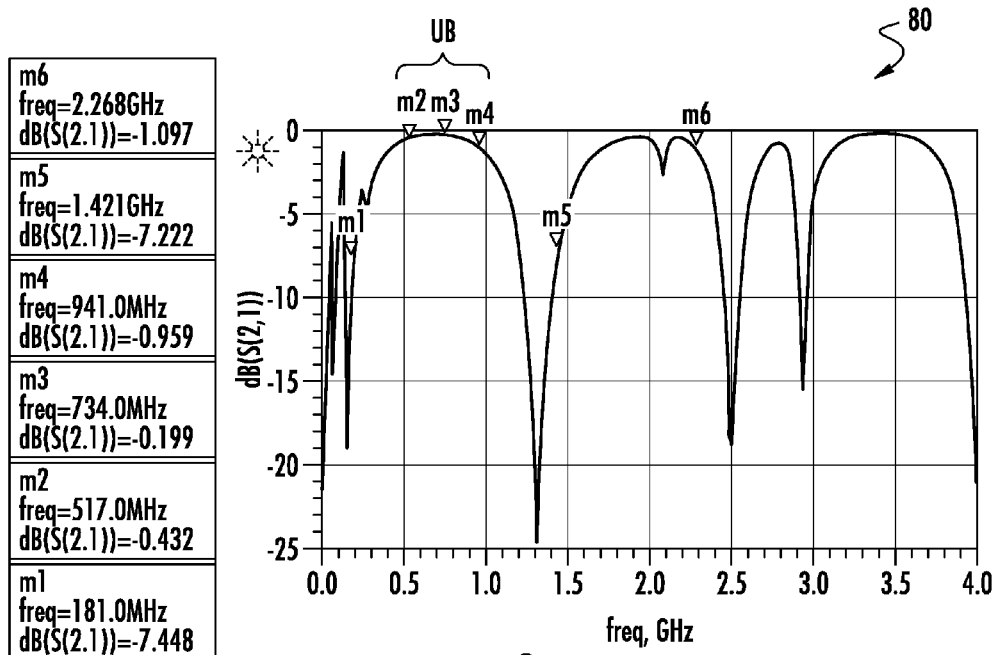
Figure 9:
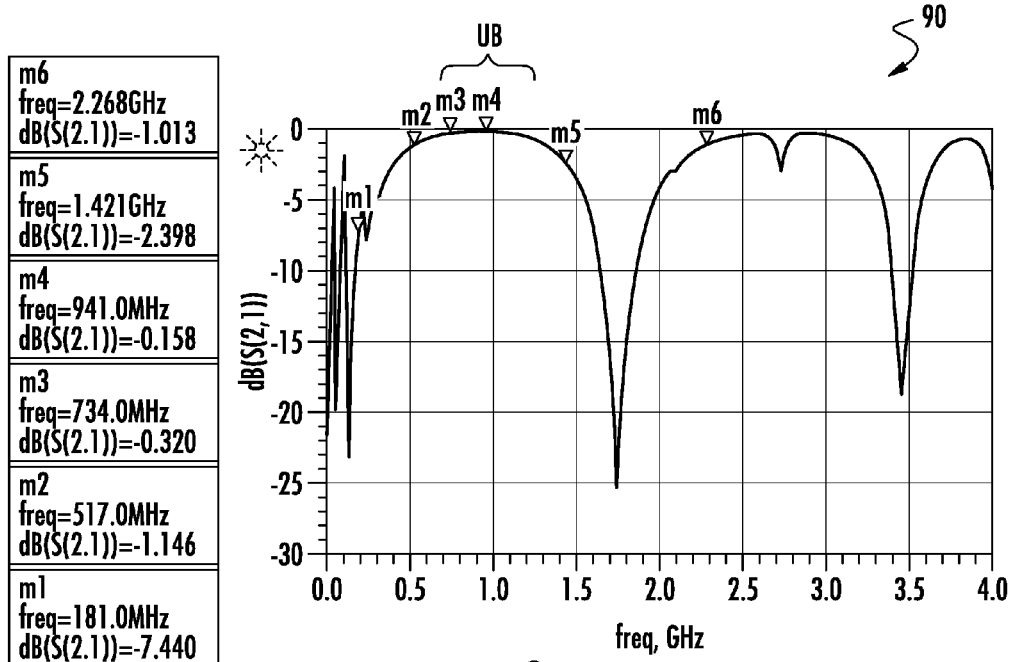
Figure 10:
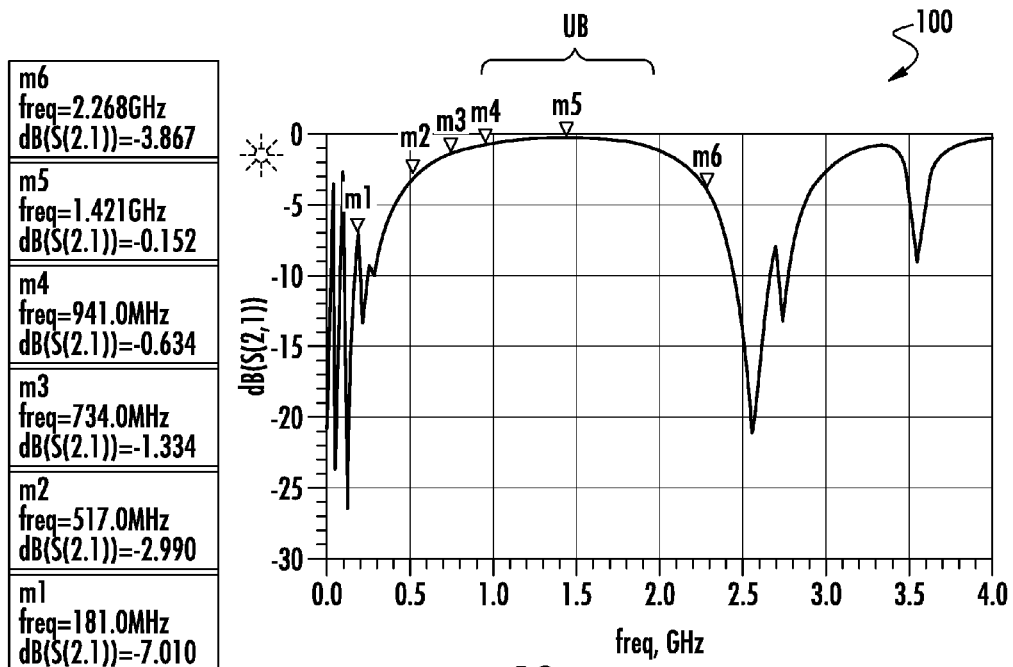
Figure 11:
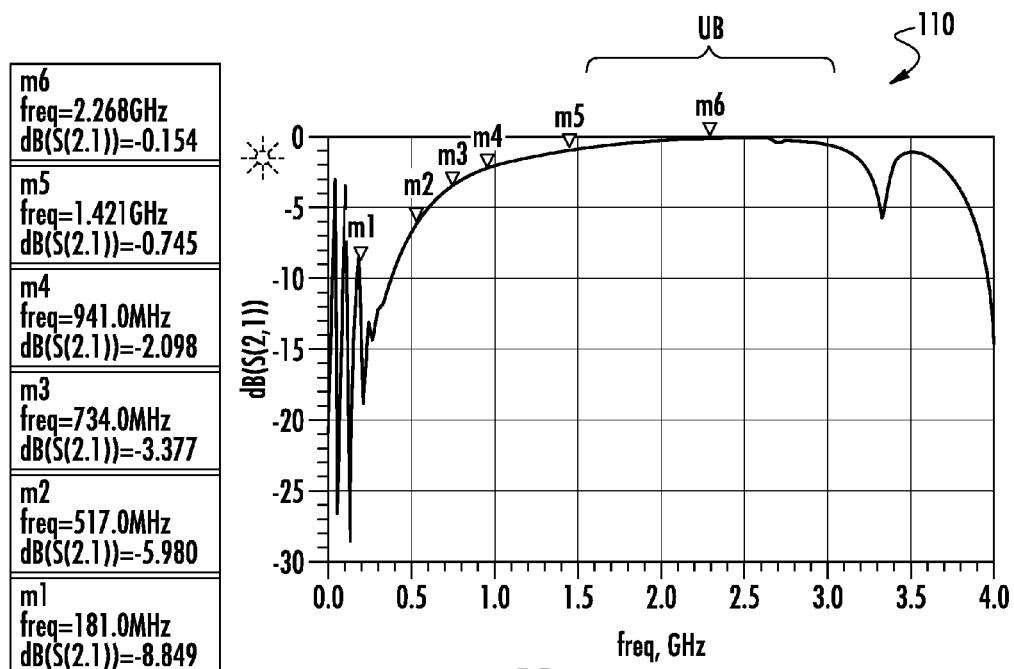

An example simulation of the switching branch 47 of the DC drain feed network 36 is now described with reference to FIG. 5. More particularly, the illustrated example is an Advanced Design System (ADS) design layout of one branch 47 from among a group of five switching branches of the DC feed network 36 which together provide wide-band operation from 225-2500 MHz (i.e., greater than three octaves). That is, the five PiN diodes of the switching branches 47 provide full RF band coverage over this range using standard PiN biasing techniques. Moreover, simulations of this configuration have achieved 180-3000 MHz of usable bias network impedances (i.e., greater than four octaves). However, it should be noted that this configuration may be adapted for other bands and lower copper trace inductances, as will be appreciated by those skilled in the art.

The switching branch 47 illustratively includes a tee Tee21 coupling the branch to the RF transmission line stub 38, which is represented as a transmission line element TL25, A PiN diode D10 has its anode connected to the tee Tee21 and its cathode connected to another tee Tee20. A first extension of the tee Tee20 illustratively includes transmission line segment TL26, an inductor SNP10, and a capacitor C22 connected in series to ground, and a second extension of the tee Tee20 includes a capacitor C21 connected to ground.

Simulations using the above-noted switching configuration are presented in respective graphs 60, 70, 80, 90, 100, and 110 of FIGS. 6-11. In the graphs 60, 70, 80, 90, 100, and 110, the points m1-m6 correspond to six different PiN diode D10 switching configurations and corresponding operating frequencies. More particularly, in the graph 60, all of the PiN diodes D10 are switched off, providing a usable frequency band (UB) associated with the point m1 at 181 MHz, as seen in the associated legend. In the graph 70, a first one of the PiN diodes D10 (i.e., the PiN diode farthest from the drain) is turned on, shifting the usable frequency band about the point m2 (i.e., 517 MHz) as shown.

Similarly, in the graph 80, two of the PiN diodes D10 (i.e., the two PiN diodes farthest from the drain) are turned on, shifting the usable frequency band about the point m3 (i.e., 734 MHz). In the graph 90, three of the PiN diodes D10 (i.e., the three PiN diodes farthest from the drain) are turned on, shifting the usable frequency band about the point m4 (i.e., 941 MHz). In the graph 100, four of the PiN diodes D10 (i.e., the four PiN diodes farthest from the drain) are turned on, shifting the usable frequency band about the point m5 (i.e., 1.421 GHz). Finally, in the graph 110, all five of the PiN diodes D10 are turned on, shifting the usable frequency band about the point m6 (i.e., 2.268 GHz).

The DC feed network 36 accordingly allows for a relatively low-inductance feed over multiple octaves. Moreover, the configuration may advantageously enable envelope tracking on multi-octave power amplifiers. Thus, the above-described configuration may be used for envelope tracking in accordance with various wireless communications formats, including WCDMA, LTE and WIMAX applications, as well as in other communications formats such as S band or other military/tactical bands, as will be appreciated by those skilled in the art.

In addition, the DC feed network 36 may improve linearity and eliminate non-quasi stable distortion effects in wide signal bandwidths (e.g., greater than 5 MHz). As discussed above, use of the optional inductor SNP11 advantageously allows for extended RF performance for narrowband applications, e.g., down to the UHF/VHF range.

A related method is for operating a power amplifier 32. The method may include selectively operating the RF shorting switch(es) 42 to set an operating frequency band of the power amplifier, as discussed further above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications device comprising:
 a power amplifier having an input and an output;
 a direct current (DC) feed network comprising
  a radio frequency (RF) transmission line stub having a first end coupled to the output of said power amplifier and a second end coupled to a DC feed voltage, and
  a plurality of RF shorting switch switches coupled between a corresponding location along said RF transmission line stub and a voltage reference; and
 a controller configured to selectively operate the plurality of RF shorting switches in a sequential order beginning with the RF shorting switch farthest away from the power amplifier to set an operating frequency band of said power amplifier.

2. The communications device of claim 1 wherein each of said plurality of RF shorting switches is coupled to spaced apart locations along said RF transmission line stub.

3. The communications device of claim 1 wherein each of said RF shorting switches comprises a PIN diode.

4. The communications device of claim 1 wherein said DC feed network further comprises a capacitor in series with said plurality of RF shorting switches.

5. The communications device of claim 1 wherein said DC feed network further comprises an inductor; and wherein said controller selectively couples said inductor between the DC feed voltage and the second end of said RF transmission line stub to provide narrowband operation, and selectively couples the DC feed voltage to the second end of said RF transmission line stub to provide wideband operation.

6. The communications device of claim 5 wherein said DC feed network further comprises a baseband shorting capacitor coupled between the second end of said RF transmission line stub and the voltage reference.

7. The communications device of claim 1 wherein said power amplifier comprises a field effect transistor (FET) having a gate as the input, a source coupled to the voltage reference, and a drain as the output.

8. The communications device of claim 7 further comprising a gate feed network coupled to the gate of said FET.

9. The communications device of claim 7 further comprising an input matching network coupled to the gate of said FET.

10. The communications device of claim 7 further comprising an output matching network coupled to the drain of said FET.

11. A communications device comprising:
a field effect transistor (FET) power amplifier having a gate as an input, a source coupled to a voltage reference, and a drain as an output;
a direct current (DC) feed network comprising
a radio frequency (RF) transmission line stub having a first end coupled to the output of said power amplifier and a second end coupled to a DC feed voltage, and
a plurality of RF shorting switches each coupled between respective spaced apart locations along said RF transmission line stub and a voltage reference, said RF shorting switches comprising PiN diodes; and
a controller configured to selectively operate the plurality of RF shorting switches in a sequential order beginning with the RF shorting switch farthest away from the power amplifier to set an operating frequency band of said power amplifier.

12. The communications device of claim 11 wherein said DC feed network further comprises a respective capacitor in series with each of said plurality of RF shorting switches.

13. The communications device of claim 11 wherein said DC feed network further comprises an inductor; and wherein said controller selectively couples said inductor between the DC feed voltage and the second end of said RF transmission line stub to provide narrowband operation, and selectively couples the DC feed voltage to the second end of said RF transmission line stub to provide wideband operation.

14. The communications device of claim 11 further comprising a gate feed network coupled to the gate of said FET.

15. The communications device of claim 11 further comprising an input matching network coupled to the gate of said FET.

16. The communications device of claim 11 further comprising an output matching network coupled to the drain of said FET.

17. A method for operating a power amplifier having an input and an output and comprising:
selectively operating a plurality of RF shorting switches coupled between a corresponding location along a radio frequency (RF) transmission line stub and a voltage reference in a sequential order beginning with the RF shorting switch farthest away from the power amplifier to set an operating frequency band of the power amplifier;
the RF transmission line stub having a first end coupled to the output of the power amplifier and a second end coupled to a DC feed voltage.

18. The method of claim 17 wherein each of the plurality of RF shorting switches is coupled to spaced apart locations along the RF transmission line stub.

19. The method of claim 17 wherein each of the RF shorting switches comprises a PIN diode.

20. The method of claim 17 wherein the DC feed network further comprises a capacitor in series with the plurality of RF shorting switches.

21. The method of claim 17 wherein the DC feed network further comprises an inductor; and further comprising selectively coupling the inductor between the DC feed voltage and the second end of the RF transmission line stub to provide narrowband operation, and selectively coupling the DC feed voltage to the second end of the RF transmission line stub to provide wideband operation.

22. The method of claim 17 wherein the power amplifier comprises a field effect transistor (FET) having a gate as the input, a source coupled to the voltage reference, and a drain as the output.

* * * * *